(12) United States Patent
Hayes et al.

(10) Patent No.: US 12,000,684 B2
(45) Date of Patent: Jun. 4, 2024

(54) MISSILE COMPRISING ELECTRONICS AND A JUMPING-DROP VAPOUR CHAMBER

(71) Applicant: MBDA UK LIMITED, Stevenage (GB)

(72) Inventors: David John Richard Hayes, Stevenage (GB); Richard William Cronk, Stevenage (GB)

(73) Assignee: MBDA UK LIMITED, Stevenage (GB)

( * ) Notice: Subject to any disclaimer, the term of this patent is extended or adjusted under 35 U.S.C. 154(b) by 300 days.

(21) Appl. No.: 17/602,406

(22) PCT Filed: Apr. 9, 2020

(86) PCT No.: PCT/GB2020/050932
§ 371 (c)(1),
(2) Date: Oct. 8, 2021

(87) PCT Pub. No.: WO2020/208365
PCT Pub. Date: Oct. 15, 2020

(65) Prior Publication Data
US 2022/0205768 A1 Jun. 30, 2022

(30) Foreign Application Priority Data

Apr. 10, 2019 (EP) .................................... 19275050
Apr. 10, 2019 (GB) .................................... 1905068

(51) Int. Cl.
*F42B 15/34* (2006.01)
*F42B 15/10* (2006.01)
*H05K 7/20* (2006.01)

(52) U.S. Cl.
CPC .............. *F42B 15/34* (2013.01); *F42B 15/10* (2013.01); *H05K 7/2029* (2013.01); *H05K 7/20472* (2013.01)

(58) Field of Classification Search
CPC ....... F42B 15/34; F42B 15/10; H05K 7/2029; H05K 7/20472
See application file for complete search history.

(56) References Cited

U.S. PATENT DOCUMENTS 4,057,104 A * 11/1977 Altoz ...................... F28D 15/02
343/705
4,377,198 A 3/1983 Welling et al.
(Continued)

FOREIGN PATENT DOCUMENTS

| EP | 1 218 965 B1 | 1/2007 |
| WO | 2010/124025 A2 | 10/2010 |
| WO | 2017/052848 A1 | 3/2017 |

OTHER PUBLICATIONS

Preliminary Report on Patentability and Written Opinion dated Oct. 21, 2021 from related PCT/GB2020/050932.
(Continued)

*Primary Examiner* — Joshua E Freeman
(74) *Attorney, Agent, or Firm* — Scully, Scott, Murphy & Presser, P.C.

(57) ABSTRACT

There is disclosed a missile comprising an outer skin, an electronics unit, and a thermal link between the electronics unit and the outer skin. The thermal link comprises a jumping drop vapour chamber arranged such that, when the outer skin is at an elevated temperature relative to the electronics unit, the electronics unit is thermally insulated from the outer skin; and such that, when the outer skin is at a lower temperature relative to the electronics unit, the electronics unit is thermally linked to the outer skin.

15 Claims, 3 Drawing Sheets

(56) References Cited

U.S. PATENT DOCUMENTS

| | | | |
|---|---|---|---|
| 4,673,030 A | 6/1987 | Basiulis | |
| 6,404,636 B1* | 6/2002 | Staggers | H05K 7/20445 |
| | | | 165/185 |
| 8,716,689 B2* | 5/2014 | Chen | H01L 23/427 |
| | | | 438/54 |
| 2003/0047103 A1* | 3/2003 | Rabin | F28D 15/02 |
| | | | 102/293 |
| 2004/0037045 A1* | 2/2004 | Phillips | F28D 15/0233 |
| | | | 361/719 |
| 2012/0012804 A1* | 1/2012 | Chen | H01L 23/427 |
| | | | 165/104.21 |
| 2014/0247556 A1* | 9/2014 | Eid | H01L 23/3675 |
| | | | 29/592.1 |
| 2017/0038159 A1 | 2/2017 | Wood et al. | |
| 2018/0216898 A1 | 8/2018 | Ockfen et al. | |
| 2019/0393131 A1* | 12/2019 | Eid | H01L 23/473 |
| 2019/0393192 A1* | 12/2019 | Eid | H01L 24/73 |
| 2019/0393193 A1* | 12/2019 | Eid | H01L 25/0652 |

OTHER PUBLICATIONS

International Search Report and Written Opinion dated Jun. 26, 2020 issued in PCT/GB2020/050932.
Extended EP Search Report dated Sep. 30, 2019 issued in EP 19275050.
GB Search Report dated Oct. 1, 2019 issued in GB 1905068.1.
Zhou, Feng et al., "Vapor chamber with thermal diode and switch functions", 2017 16th IEEE Intersociety Conference On Thermal and Thermomechanical Phenomena in Electronic Systems (ITHERM), (May 1, 2017), pp. 521-528.
Wiedenheft, Kris F., "Hotspot cooling with jumping-drop vapor chambers", Applied Physics Letters 110 (Apr. 3, 2017), pp. 141601-1-141601-5.
Wen, Rongfu, "Three-Dimensional Superhydrophobic Nanowire Networks for Enhancing Condensation Heat Transfer", Joule 2 (Feb. 21, 2018), Elsevier Inc., pp. 269-279.

* cited by examiner

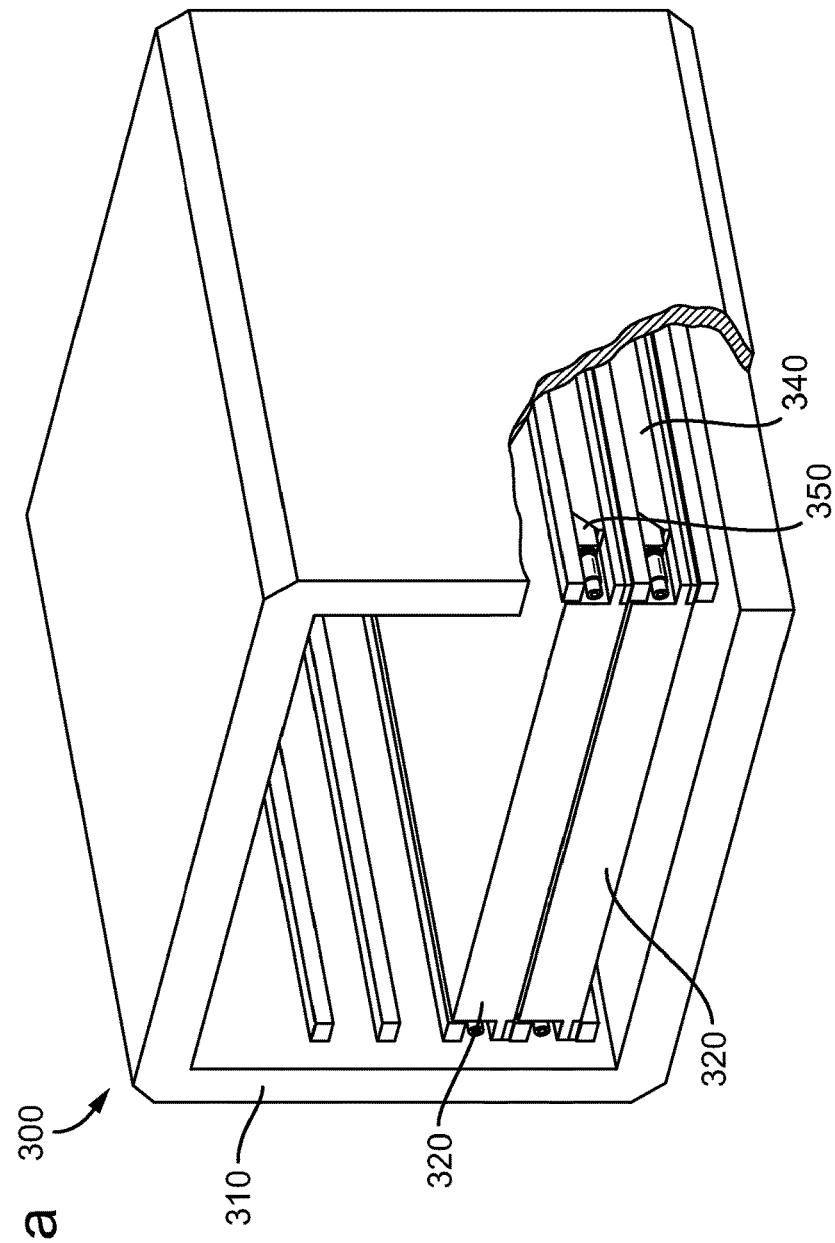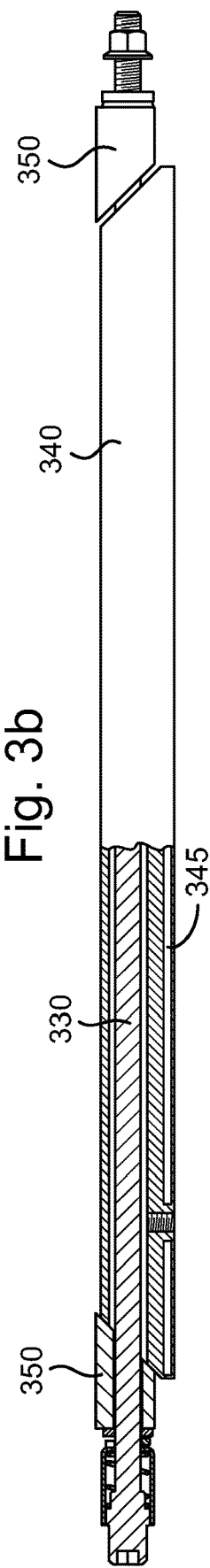

MISSILE COMPRISING ELECTRONICS AND A JUMPING-DROP VAPOUR CHAMBER

FIELD OF THE INVENTION

This invention relates to a missile comprising a thermal link between an electronics unit comprised in the missile and the missile outer skin. More particularly, but not exclusively, the invention relates to a missile comprising a thermal link in which a thermal diode is arranged to enable the temperature of the electronics to be managed appropriately in a variety of different missile operating conditions.

BACKGROUND

Current missile systems comprise electronic circuit boards and other components implementing functions of considerable complexity that typically operate over considerable amounts of time. As the complexity of the requirements for electronics rise, and the amount of time over which those electronics must be operated rises, the requirements for heat generated by those electronics to be appropriately managed become more significant. Many electronics components function optimally within a limited temperature range. Heat generated by their operation must be removed if these components are to remain within that limited temperature range over an extended period of time.

In certain circumstances, the missile skin can provide a heat dump for this generated heat. However, the missile skin can heat significantly as a result of air friction whilst the missile moves at high speeds. In these conditions the skin becomes a source of heat, rather than a possible heat sink, and it can be necessary to insulate the electronics from the skin so that the components do not overheat. U.S. Pat. No. 6,404,636 discloses a packaging method for controlling heat transfer from missile avionics components to an external environment through an airframe. A shape memory alloy having a phase change at a predetermined temperature is used to thermally disconnect the electronics from the airframe at that temperature, and a spring is used to maintain thermal contact below the predetermined temperature.

SUMMARY OF THE INVENTION

In accordance with a first aspect of the present invention there is provided a missile comprising an outer skin, an electronics unit, and a thermal link between the electronics unit and the outer skin, wherein the thermal link comprises a jumping drop vapour chamber arranged such that, when the outer skin is at an elevated temperature relative to the electronics unit, the electronics unit is thermally insulated from the outer skin; and such that, when the outer skin is at a lower temperature relative to the electronics unit, the electronics unit is thermally linked to the outer skin.

As is described in further detail below, the jumping drop vapour chamber operates as a thermal diode, its thermal conductivity differing in dependence upon the direction of an applied thermal gradient. The vapour in the jumping drop vapour chamber is responsible for thermal transport across the chamber. When the vapour condenses into a droplet on one surface of the chamber, the droplet jumps across the chamber to an opposite surface on to which it is adsorbed and from which it can evaporate. A cycle of evaporation and condensation is made possible only in one direction by selection of the surface properties.

The jumping drop vapour chamber has no moving parts and as a result is expected to be more reliable than systems relying on a mechanical movement to switch between thermally-conducting and non-thermally-conducting states. This assists the missile to maintain the electronics unit at an appropriate temperature, both when the outer skin can be used to dissipate heat generated by the electronics unit and when the outer skin is at an elevated temperature relative to the electronics unit. Moreover the jumping drop vapour chamber is scalable without the addition of further mechanical complexity. Such mechanical complexity is undesirable in missile applications since missiles can be stored for a significant length of time prior to use, and mechanical systems can be subject to problems such as jamming or sticking as a result of the accumulation of dirt from the environment.

The jumping drop vapour chamber may comprise a first, condensing surface, and a second, evaporating surface; the first and second surfaces being generally parallel; the first surface being in thermal communication with the outer skin, and the second surface being in thermal communication with the electronics unit. The first surface may be arranged such that droplets condensing thereon spontaneously jump off the first surface towards the second surface. For example, the first surface may be a super-hydrophobic surface. The second surface may be arranged such that water droplets are adsorbed thereon. For example the second surface may have wicking properties. The second surface may be a super-hydrophilic surface.

The outer skin and the electronics unit may be fastened to a missile airframe, and the electronics unit may be fastened to the missile airframe by thermally insulating fasteners. The thermally insulating fasteners can provide additional structural support to the electronics unit without compromising the beneficial thermal behaviour of the jumping drop vapour chamber by providing a parallel thermal link.

There may be a thermal gap pad located between the jumping drop vapour chamber and the outer skin. The gap pad assists in providing continuous mechanical contact between the chamber and the outer skin, and hence in enhancing the thermal contact between the chamber and the outer skin.

The thermal link may further comprise a thermal capacitor in thermal communication with the electronics unit, the thermal capacitor being configured to absorb heat from the electronics unit when the outer skin is at an elevated temperature relative to the electronics unit. A thermal capacitor is capable of storing thermal energy. The provision of a thermal capacitor able to absorb thermal energy when the outer skin is at an elevated temperature relative to the electronics unit and cannot therefore be used to dissipate heat. The thermal capacitor therefore assists in maintaining the electronics unit at an appropriate temperature for a longer period when the missile is in flight at high speed and air friction significantly raises the temperature of the outer skin. The thermal capacitor may comprise a phase change material. The phase change material may exhibit a change phase at a temperature selected such that the thermal capacitor absorbs heat from the electronics unit when the outer skin is at an elevated temperature relative to the electronics unit. The change of phase may be at a temperature in the range between 70° C. and 100° C., preferably at a temperature of 85° C. Paraffin wax can be a suitable phase change material.

The jumping drop vapour chamber may comprise a thermally insulating wall, which wall, in combination with the first and second surfaces, defines the chamber of the jumping drop vapour chamber, and wherein the wall is mechanically resilient. Such resilience is beneficial since the interior components of the missile can be subject to significant vibration during air carriage and/or missile flight.

The first and/or second surfaces may be curved. This allows for greater design flexibility for the missile. For example, the first surface of the jumping drop vapour chamber may be curved. The first surface may abut the outer skin of the missile.

The jumping drop vapour chamber may be provided within a mechanical fastening. Providing the jumping drop vapour chamber within a mechanical fastening removes the need for any additional components to be added to the missile, which may add mass and/or complexity to the missile, or may require increased space within the missile body. There can be considerable constraints on space and weight in many aerospace applications. For example, the jumping drop vapour chamber may be provided within a washer forming a part of the fastening between the electronics unit and the missile airframe. The jumping drop vapour chamber may be provided within a mechanical fastening between one of the one or more electronics components and the outer enclosure of the electronics unit. The mechanical fastening may for example be a wedge lock.

BRIEF DESCRIPTION OF THE DRAWINGS

Embodiments of the invention will now be described by way of example only and with reference to the accompanying drawings, of which.

DETAILED DESCRIPTION

Figure 1:
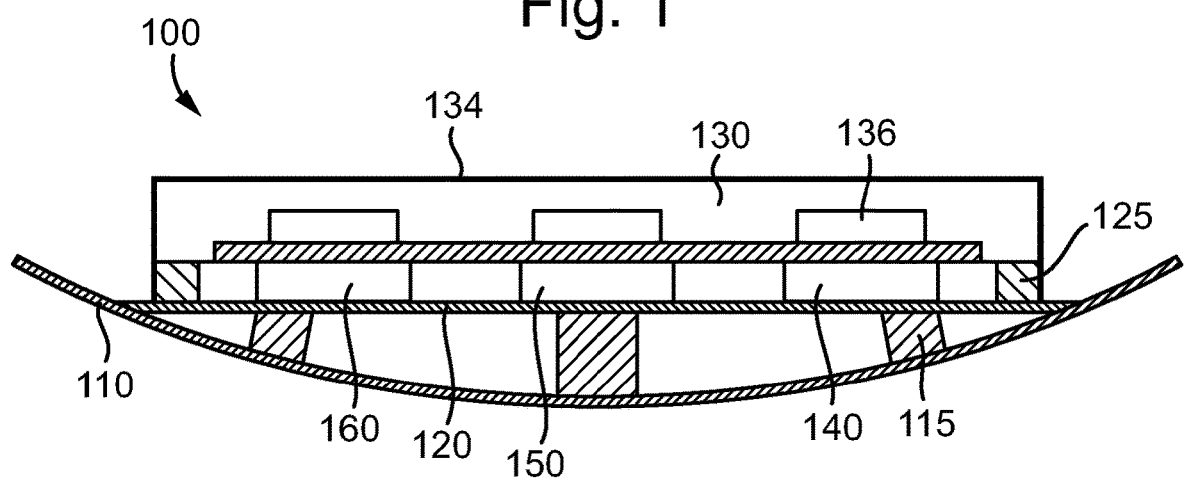
FIG. 1 is a schematic illustration of a cross section through a part of a missile according to a first embodiment of the invention.

Embodiments of the present invention use one or more thermal diodes positioned between a missile electronics unit and the missile skin. The thermal diode allows heat to be transferred from the electronics unit to the missile skin when the electronics unit is at a higher temperature than the missile skin. However, heat transfer does not occur in the same way in the opposite direction: heat transfer from the missile skin to the electronics unit is limited when the missile skin is at a high temperature than the electronics unit. The thermal diode is provided by a jumping drop vapour chamber (JDVC).

In the embodiments described below the JDVC comprises first and second generally parallel plates which, together with a thermally insulating wall, define a sealed chamber containing an amount of water vapour. The wall may for example be made of a thermally insulating ceramic material, with rubber (eg EDPM) gaskets used to seal the interface between the wall and the first and second plates. Ceramic to metal joints may also be used to join the wall to the first and second plates. The wall is also provided with filling and vacuum ports to enable water to be introduced into the chamber, and so that other gases can be removed.

The first of the parallel plates is a super-hydrophobic condenser plate, and the second is a super-hydrophilic evaporator plate. The amount of water in the chamber is sufficient to just soak the super-hydrophilic plate at approximately room temperature. Both plates can be made from appropriately treated copper, the super-hydrophilic surface for example being coated with sintered copper particles (as per Zhou et al in the 16th IEEE Intersociety Conference on Thermal and Thermomechanical Phenomena in Electronics Systems, 521-528, 2017), or a micro-pillared wick can be formed in a copper surface and rendered superhydrophilic by thermal oxidisation (as per Wiedenheft et al in Applied Physics Letters 110, 141601, 2017) whilst the super-hydrophobic surface can be formed from copper nanoparticles treated with silane (as per Wiedenhaft et al) or formed from copper nanowires (as per Wen et al in Joule 2, 269-279, 2018). The gap between the plates is approximately 2 mm, whilst the area of the plates is approximately 76×76 mm. The area is scalable to enable larger surfaces to be covered by a single JDVC if required.

When the evaporator plate is at a relatively high temperature, water will evaporate from the evaporator plate into the chamber and condense on the relatively cooler condense plate. Droplets are formed which, on reaching a certain size, spontaneously jump from the condenser plate towards the evaporator plate, because of its super-hydrophobic property. These droplets spread across the surface of the super-hydrophilic evaporator plate and subsequently re-evaporate back into the chamber. Heat is absorbed from the evaporator when the water evaporates, and transferred to the condenser plate when the water vapour condenses. The cycle of condensation and evaporation can then repeat so as to establish a continuous transfer of heat from the evaporator plate to the condenser plate.

However, when the relative temperatures are reversed, and the super-hydrophobic condenser plate is relatively hot, whilst the super-hydrophilic evaporator plate is relatively cool, water will not preferentially evaporate from the evaporator plate. As a result the heat transfer mechanism is not established. Because the walls of the chamber are thermally insulating the predominant mechanism for heat transfer requires the cycle of vapour transport to continue. A relatively low rate of heat transfer may persist but in effect the chamber will function as a thermal insulator. Thus the JDVC acts as a thermal diode. JDVCs can be made with rectification coefficients of greater than 100, and thermal conductivity (in the conducting direction) of between 250 and 400 W/mK. At the upper end of the range this is similar to the thermal conductivity of copper.

FIG. 1 is a schematic illustration of a cross section through a missile 100 according to a first embodiment of the invention. The missile comprises an outer skin 110, which provides the outer surface of the missile, an equipment chassis 120, and an electronics unit 130. The electronics unit 130 is supported on the equipment chassis 120, which in turn is fastened to the outer skin 110 by thermally conducting fastenings such as bolts 115. These bring the skin 110 into close mechanical contact with the equipment chassis. This establishes good thermal contact between the equipment chassis 120 and the outer skin 110. The electronics unit 130 is fastened to the chassis 120 by thermally insulating fasteners 125, which may for example be of Pyromeral composite type material. These fasteners provide a structural connection between the electronics unit and the chassis.

The electronics unit 130 comprises an outer enclosure 134 made of a thermally conducting material, such as a metallic material, and enclosing heat generating electronic components such as circuit card assembly 136. The electronic components are thermally linked to the outer enclosure 134 of the unit such that heat generated by the components during operation can be dissipated via the enclosure. For example components may be mounted on to thermal spreaders attached to the enclosure. The thermal spreaders have a high thermal conductivity and therefore function to spread heat generated by the electronic components more widely into the outer enclosure. On one side of the enclosure there are provided a number of JDVCs 140, 150, 160. The JDVCs can be located underneath or otherwise close to the components likely to generate heat. By way of example circuit card assembly 136 is shown above JDVC 140 in FIG. 1. In missile 100 it will thus be seen that there is a thermal link between the electronics unit 130 and the outer skin 110, via the equipment chassis 120 and the JDVCs 140, 150, and 160.

Each JDVC has is arranged with its condenser plate adjacent the equipment chassis 120, and its evaporator plate adjacent the electronics unit 130. The condenser plate and the evaporator plate are arranged to be in close mechanical contact with the chassis and the electronics unit, respectively. In this way a stronger thermal link can be established. The condenser and evaporator plates, together with a thermally insulating wall, define a cavity in which there is water vapour. The wall may for example be made of a thermally insulating ceramic material. By reducing the thickness of the wall, thermal conduction between the electronics unit and the chassis can be further reduced.

Thermal communication between the JDVCs and the electronics unit can be further strengthened by increasing the area of the evaporator plate in contact with the electronics unit. Similarly, thermal communication between the JDVCs and the chassis can be further strengthened by increasing the area of the condenser plate in contact with the chassis. A flexible gap pad can be used to ensure physical contact between the JDVC and the chassis across the whole of the area of the condenser plate.

Electronics unit 130 will generate heat when functioning. In modern missiles such operation of the electronics unit is often necessary during air carriage when the missile may be held within an enclosed area. In these circumstances the ambient environment is likely to be cooler than the electronics unit and so the outer skin 110 can function as a heat dump for the heat generated by the electronics unit. As heat is generated by the electronics unit, the temperature of the evaporator plates of the JDVCs 140, 150, 160 is elevated above that of the condenser plates and heat can therefore be transferred across the JDVCs. Heat is then dissipated via the equipment chassis and the outer skin into the ambient environment.

After launch the missile will be travelling at high speed relative to the surrounding air. Frictional heating of the outer skin 110 can raise the temperature to the extent that the outer skin may become significantly hotter than the electronics unit 130. In these circumstances the evaporator places of the JDVCs 140, 150, 160 are at a lower temperature with respect to the condenser plates. In this condition the vapour in the JDVCs will not condense on the condenser plates, but will remain as vapour in the chamber or collect on the evaporator plates. The JDVCs therefore act as thermal insulators, and whilst the outer skin cannot act as a heat dump for the electronics unit, it will not further heat the electronics unit. The final phase of missile use may, however, be sufficiently short that the electronics unit will not have time to heat up to an extent detrimental to the operation of the electronic components within the unit. It will be noted that the operation of the JDVCs is not dependent on gravity, and therefore not dependent on their orientation. The thermal conductivity of the JDVC depends only on the relative temperatures of the evaporator and condenser plates. Thus their operation will not change as a result of manoeuvre of the missile.

Figure 2:
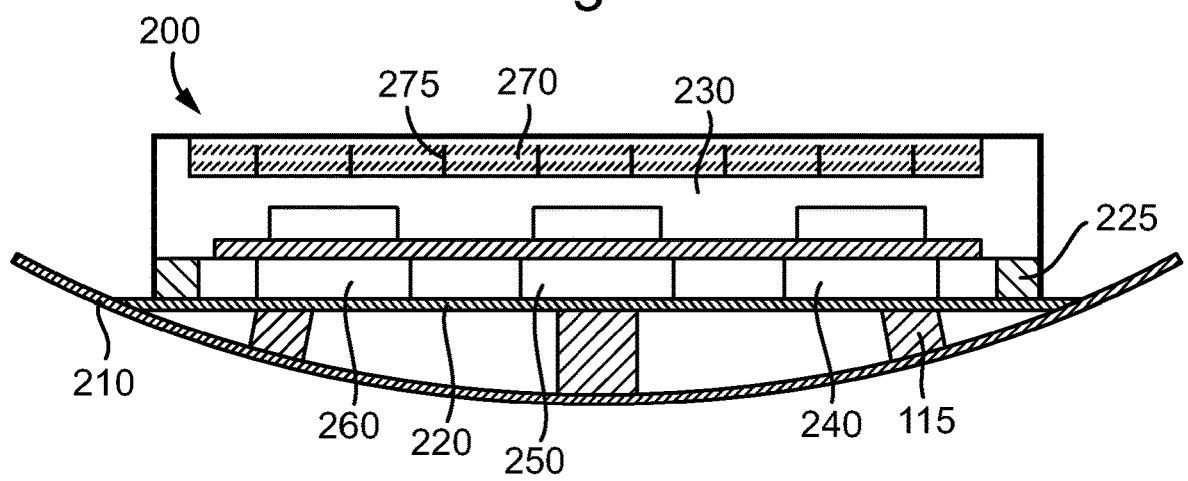
FIG. 2 is a schematic illustration of a cross section through a part of a missile according to a second embodiment of the invention.

A missile 200 according to a second embodiment of the invention is similar to the first except in that a further heat sink mechanism is included in the thermal management system. Missile 200 is shown in cross section in FIG. 2, in which those parts similar to parts in the first embodiment are given like reference numerals, incremented by 100. Missile 200 differs in that a quantity of a phase change material (PCM) 270 is in thermal communication with the electronics unit 230. As shown schematically in FIG. 2 PCM 270 is held in a cavity in a part of the structure of the electronics unit 230, with fins 275 provided to support thermal conduction through the PCM. The PCM can also be present in other parts of the electronics unit 230, such as in both the base and the upper parts of the unit 230, or can be provided externally to it if good thermal communication can be obtained.

Phase change materials can be used to store heat in thermal management systems, significant quantities of heat being required to change the phase of the material. Thus they can be used to act as a thermal capacitance. Typically the solid-liquid transition is used, with the phase change material absorbing heat as it melts, or releasing heat as it solidifies. However latent heat associated with other phase transitions can also be used. PCM 270 is selected to change phase at a temperature above that at which the electronics unit 230 can be maintained when the JDVC's 240, 250, 260 are operating to conduct heat to the missile outer skin, but below the temperature at which operation of the electronic components in the electronics unit 230 is compromised by the effect of heat. PCMs such as paraffin wax can be obtained with a range of melt temperatures between around −20° C. and 100° C., and it is expected that a melt temperature in the range between 70° C. and 100° C. would be suitable in combination with a JDVC. In the present embodiment a paraffin wax having a melting temperature of 85° C. is used.

The thermal management system of missile 200 will operate as described above with respect to missile 100 until shortly after the missile is launched. Once the JDVCs 240, 250, 260 transition to thermal insulators, the electronics unit 230 will begin to heat. This additional heat will be absorbed by the PCM 270, the temperature of which will rise until it reaches its melting point. At this point the temperature of the PCM stabilises and further heat is absorbed as a result of the PCM melting. The temperature of the electronics unit 230 is thus also controlled. In this way the temperature of the electronics unit is controlled for a longer period of time after launch. The thermal management system of missile 200 is appropriate where the missile avionics are required to function both throughout a long period of transit in a relatively low temperature ambient environment, and also for a period after launch sufficiently long that heat generated by the electronics would begin to raise the temperature of the electronics unit 230 above that at which the functionality of the unit may be compromised.

FIG. 3a is a schematic illustration of the assembly of an electronics unit 300 of a further embodiment. As above the electronics unit 300 will be fastened to the missile equipment chassis and thus thermally linked to the missile skin via the equipment chassis (not shown in FIG. 3a). The electronics unit includes an outer enclosure 310 and a number of circuit cards 320. In this configuration a wedge lock is provided to fix circuit card 320 in position in the outer enclosure 310. Wedge lock comprises wedge-shaped components 340, 350, which components are arranged on a common axis 330 such that when pushed together along the axis, the components are pushed apart in a direction perpendicular to the axis. A nut and bolt arrangement can be provided on the axis 330 to enable the components to be pushed together. FIG. 3b provides a more detailed view of the wedge lock in its expanded configuration. In this way the wedge lock can be inserted into a channel between circuit card 320 and the outer enclosure 310. The nut and bolt arrangement can be tightened so as to push the wedge components apart, thus locking the electronics board in position in the electronics chassis.

The wedge lock is provided with a JDVC 345 in the inner wedge component 340, which is in contact with the circuit card 320. The JDVC is arranged with its evaporator plate in contact with the circuit card (on the outward part of the wedge lock), and its condenser plate positioned inwardly of the condenser plate, closer to the axis of the wedge lock. As described above, the walls of the wedge lock around the JDVC are fabricated from a thermal insulator. During air carriage, whilst the electronics are functioning to generate heat, the evaporator plate is hotter than the condenser plate, and heat will flow through the JDVC in the inner wedge component to the outer wedge components of the wedge lock, and then through the outer enclosure 310 to the equipment chassis and eventually to the missile skin. However, when the outer skin of the missile is heated such that the condenser plate is hotter than the evaporator, the JDVC will prevent heat flow to the circuit card 320. Thus the wedge lock acts as a thermal diode. It will be seen that the JDVC in this embodiment does not add further components to the missile electronics as it is incorporated into the mechanism fastening the electronics board to the electronics chassis. Furthermore, where wedge locks are present in current missile systems it will be possible to retrofit such systems with wedge locks provided with JDVCs so as to improve the thermal management of such missile systems. Moreover it will be understood that each circuit card in the electronics unit 300 may have associated JDVC's at each side where the electronics board is fastened to the electronics chassis. This is therefore likely to improve the functioning of the thermal management system within the missile. It will be appreciated that the JDVC wedge lock within the electronics chassis may be used in combination with other JDVCs positioned in the thermal link from the heat generating electronic components to the missile outer skin.

Figure 4A:
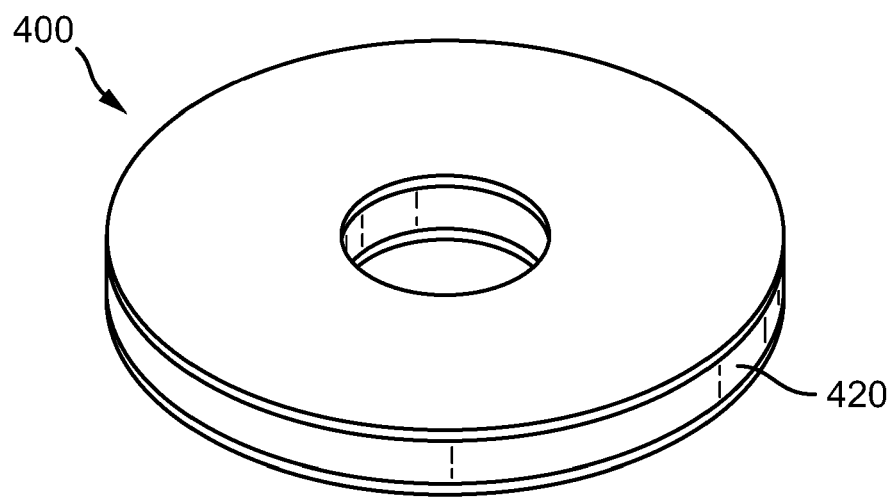
Figure 4B:
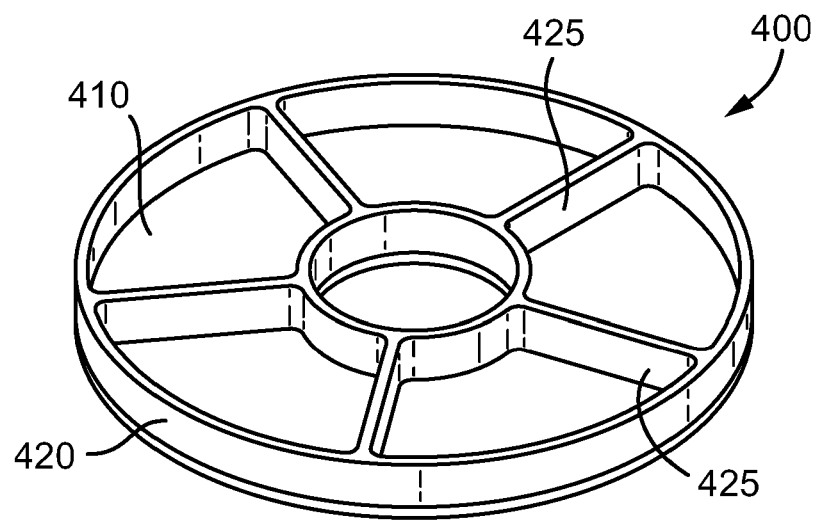

FIG. 4 is a schematic illustration of a washer 400 incorporating a JDVC, with top plate removed. The JDVC in the washer functions as a thermal diode in the manner described above, with an evaporator surface on one of the opposing flat circular surfaces, for example surface 410 illustrated, and a condenser surface on the other (not shown in the view illustrated). The wall 420 of the washer is fabricated from a thermal insulator, as described above, and in addition further thermally insulating ribs 425 are provided internally to the washer to provide additional mechanical strength to the washer. Both the wall 420 and the ribs 425 can be mechanically resilient. Washer 400 can be used as part of a fastening mechanically linking the electronics unit to the missile airframe. In such an arrangement a thermal diode is present in the thermal link between the electronics and the missile outer skin without any requirement for additional or complex components that may add unnecessary weight or complexity to the missile design.

Whilst a number of exemplary embodiments have been described in the above, it will be noted that variations and modifications to the above-described embodiments will be possible. For example, whilst in the above a thermal link between the electronic unit and the missile outer skin is described to include the equipment chassis, in other embodiments it may be possible to form a direct thermal link between the electronics unit and outer skin. The condenser and evaporator plates of the JDVC may be curved, for example so as to facilitate positioning the JDVC close to the missile outer skin. The thermally insulating wall of the JDVC may also be made of a non-ceramic material. It may for example be possible to manufacture the walls from a mechanically resilient material so that, as well as being thermally insulating, the gap between the condensing and evaporating plates can vary to allow some compliance such that good thermal contact is maintained between the electronics unit and the outer skin even when the missile is subject to vibration, for example during air carriage. For example, the walls may be made of silicone or rubber.

It will also be recognised that, whilst the JDVCs have been described as separate components above, it will be possible to manufacture an electronics unit in which the JDVCs are integral with the housing of the electronics unit, the housing itself providing the condenser plate of the JDVC. Those skilled in the art will also appreciate that the JDVC need not be filled with water. For example, methanol could be used instead of the water, with the condenser and evaporator plates having appropriate surface properties for the JDVC to operate with methanol. Appropriate surface properties to work with methanol are expected to be very similar to those that would function for water. Other vapour substances could also be used.

Finally, it should be clearly understood that any feature described above in relation to any one embodiment may be used alone, or in combination with other features described, and may also be used in combination with one or more features of any other of the embodiments, or any combination of any other of the embodiments.

The invention claimed is:

1. A missile comprising an outer skin, an electronics unit, the electronics unit comprising one or more electronic components and an outer enclosure, the missile further comprising a thermal link between the one or more electronic components and the outer skin, wherein the thermal link comprises a jumping drop vapour chamber arranged such that, when the outer skin is at an elevated temperature relative to the one or more electronic components, the one or more electronic components are thermally insulated from the outer skin; and such that, when the outer skin is at a lower temperature relative to the one or more electronic components, the electronic components are thermally linked to the outer skin, and the missile further comprising a thermal gap pad located between the jumping drop vapour chamber and the outer skin.

2. A missile as claimed in claim 1, wherein the jumping drop vapour chamber comprises a first, condensing surface, and a second, evaporating surface; the first and second surfaces being generally parallel; the first surface being in thermal communication with the outer skin, and the second surface being in thermal communication with the one or more electronic components.

3. A missile as claimed in claim 2, wherein the first and/or second surfaces are curved.

4. A missile as claimed in claim 2, wherein the first surface abuts the outer skin of the missile.

5. A missile as claimed in claim 1, wherein the first surface is a super-hydrophobic surface, and the second surface is a super-hydrophilic surface.

6. A missile as claimed in claim 1, wherein the outer skin and the electronics unit are fastened to a missile airframe, and wherein the electronics unit is fastened to the missile airframe by thermally insulating fasteners.

7. A missile as claimed in claim 1, wherein the thermal link further comprises a thermal capacitor in thermal communication with the electronics unit, the thermal capacitor being configured to absorb heat from the electronics unit when the outer skin is at an elevated temperature relative to the electronics unit.

8. A missile as claimed in claim 7, wherein the thermal capacitor comprises a phase change material.

9. A missile as claimed in claim 8, wherein the phase change material exhibits a change phase at a temperature selected such that the thermal capacitor absorbs heat from the electronics unit when the outer skin is at an elevated temperature relative to the electronics unit.

10. A missile as claimed in claim 8, wherein the phase change material exhibits a change of phase at a temperature in the range between 70° C. and 100° C.

11. A missile comprising an outer skin, an electronics unit, the electronics unit comprising one or more electronic components and an outer enclosure, and the missile further comprising a thermal link between the one or more electronic components and the outer skin, wherein the thermal link comprises a jumping drop vapour chamber arranged such that, when the outer skin is at an elevated temperature relative to the one or more electronic components, the one or more electronic components are thermally insulated from the outer skin; and such that, when the outer skin is at a lower temperature relative to the one or more electronic components, the electronic components are thermally linked to the outer skin, wherein the jumping drop vapour chamber comprises a first, condensing surface, and a second, evaporating surface; the first and second surfaces being generally parallel; the first surface being in thermal communication with the outer skin, and the second surface being in thermal communication with the one or more electronic components and wherein the jumping drop vapour chamber comprises a thermally insulating wall, which wall, in combination with the first and second surfaces, defines a chamber of the jumping drop vapour chamber, and wherein the wall is mechanically resilient.

12. A missile comprising an outer skin, an electronics unit, the electronics unit comprising one or more electronic components and an outer enclosure, and the missile further comprising a thermal link between the one or more electronic components and the outer skin, wherein the thermal link comprises a jumping drop vapour chamber arranged such that, when the outer skin is at an elevated temperature relative to the one or more electronic components, the one or more electronic components are thermally insulated from the outer skin; and such that, when the outer skin is at a lower temperature relative to the one or more electronic components, the electronic components are thermally linked to the outer skin, wherein the jumping drop vapour chamber is provided within a mechanical fastening.

13. A missile as claimed in claim 12, wherein the outer skin and the electronics unit are fastened to a missile airframe, and wherein the jumping drop vapour chamber is provided within a washer forming a part of the fastening between the electronics unit and the missile airframe.

14. A missile as claimed in claim 12, wherein the jumping drop vapour chamber is provided within a mechanical fastening between one of the one or more electronics components and the outer enclosure of the electronics unit.

15. A missile as claimed in claim 14, wherein the mechanical fastening is a wedge lock.

* * * * *